US008941546B2

(12) United States Patent
King

(10) Patent No.: US 8,941,546 B2
(45) Date of Patent: Jan. 27, 2015

(54) MOBILE TELEVISION ANTENNA WITH INTEGRAL SIGNAL METER DISPLAY

(75) Inventor: Lael King, Minneapolis, MN (US)

(73) Assignee: Electronic Controlled Sytems, Inc., Bloomington, MN (US)

( * ) Notice: Subject to any disclaimer, the term of this patent is extended or adjusted under 35 U.S.C. 154(b) by 244 days.

(21) Appl. No.: 13/350,761

(22) Filed: Jan. 14, 2012

(65) Prior Publication Data

US 2012/0182191 A1 Jul. 19, 2012

Related U.S. Application Data

(60) Provisional application No. 61/433,175, filed on Jan. 14, 2011.

(51) Int. Cl.

*H01Q 1/32* (2006.01)
*H01Q 1/06* (2006.01)
*G01R 29/08* (2006.01)
*H01Q 3/02* (2006.01)
*H01Q 1/12* (2006.01)

(52) U.S. Cl.

CPC ............... *H01Q 3/02* (2013.01); *H01Q 1/1257* (2013.01); *H01Q 1/3275* (2013.01)
USPC ............................ 343/714; 343/721; 343/894

(58) Field of Classification Search

CPC ............................ H01Q 1/3275; H01Q 1/125
USPC ........................................................ 343/714
See application file for complete search history.

(56) References Cited

U.S. PATENT DOCUMENTS 3,665,477 A * 5/1972 Budrow et al. ............... 343/714
3,739,387 A 6/1973 Budrow et al.
4,663,632 A * 5/1987 Budrow et al. ............... 343/714
5,262,793 A 11/1993 Sperry
5,467,477 A 11/1995 Furuta et al.
5,587,717 A 12/1996 Jang
5,907,371 A 5/1999 McNay et al.
5,966,638 A 10/1999 Mita et al.
6,104,341 A 8/2000 Mita et al.
6,216,266 B1 4/2001 Eastman et al.
7,358,909 B2 4/2008 Sherwood
7,570,222 B2 * 8/2009 King ............................ 343/765

(Continued)

OTHER PUBLICATIONS

Search Report and Written Opinion for PCT/US2012/021394, dated Aug. 14, 2012, 10 pages.

(Continued)

*Primary Examiner* — Dameon E Levi
*Assistant Examiner* — Ricardo Magallanes
(74) *Attorney, Agent, or Firm* — Skaar Ulbrich Macari, P.A.

(57) ABSTRACT

The present disclosure is directed to a rooftop-mounted off-air television antenna system, device and method including an integrated signal meter. The antenna portion of the device is mounted to the roof of a vehicle. An antenna adjustment mechanism is located inside of the vehicle cabin. The adjustment mechanism enables the user to adjust a position of the antenna on the roof, such as by rotating a dial that is coupled to the antenna. A signal meter is disposed in the adjustment mechanism and electrically connected to the antenna. A display of the signal meter readout is disposed in the adjustment mechanism in a location that can be easily viewed by a user during an aiming operation. The display allows the user to determine when the antenna has been positioned in order to obtain the approximate maximum signal strength possible given the vehicle's current location.

15 Claims, 5 Drawing Sheets

(56) References Cited

U.S. PATENT DOCUMENTS

| | | | | |
|---|---|---|---|---|
| 7,750,977 | B2 | 7/2010 | Dinwiddie | |
| 8,466,965 | B2 | 6/2013 | Murphy et al. | |
| 2002/0033776 | A1 | 3/2002 | Kallina | |
| 2004/0160375 | A1 * | 8/2004 | King | 343/757 |
| 2006/0033843 | A1 | 2/2006 | Klopfenstein et al. | |
| 2012/0127321 | A1 * | 5/2012 | Murphy et al. | 348/184 |

OTHER PUBLICATIONS

Page 103 of Feb. 2010 article "Product Test—TV signal finders" from www.practicalcaravan.com, 1 page.

* cited by examiner

MOBILE TELEVISION ANTENNA WITH INTEGRAL SIGNAL METER DISPLAY

PRIORITY

This application claims benefit of U.S. Provisional Patent Application Ser. No. 61/433,175, filed Jan. 14, 2011, which is hereby incorporated herein by reference in its entirety.

FIELD

The present invention generally relates to mobile television antenna systems. More particularly, the present invention relates to a mobile television antenna for use in a vehicle, including a signal meter display integrated into the antenna adjustment mechanism housing.

BACKGROUND

People like to watch television on the go and when away from home. For example, people who travel by recreational vehicles (RVs) and camping trailers desire to watch broadcast television either while in transit, or while at their destination. Such persons typically have two options for viewing television programming, off-air (over-the-air terrestrial broadcast) and satellite broadcast reception.

Off-air television signals are transmitted from earth-based transmitters over the VHF and UHF frequency bands. These transmitted, sometimes called "off-air", signals remain popular because the programming transmitted by these signals is free to view. In contrast, most television transmitted via satellite transmission requires payment of a subscription fee to view the transmitted programming. Off-air antennas also allow the user to receive local programming at a destination that corresponds to that destination, whereas satellite broadcasts contain local programming for only one location regardless of where the user is physically located. Sometimes purchasers of satellite transmission services supplement their subscription services with off-air reception in order to receive local programming that is not available or is sold for additional fees by the subscription service provider. This supplementation is becoming particularly prevalent with the 2009 switchover from analog to digital terrestrial television signals in the United States.

Signal strength received from terrestrial transmitters weakens as the distance away from the transmitter becomes greater. At a certain distance from the transmitter, the signal will become too weak to be viable. For analog television signals that are too weak, the picture on the television appliance will become fuzzy or snowy if it can be received at all. For digital television signals, no picture will display on the television if the signal is too weak. Off-air antennas are usually mounted on the rooftop of a recreational vehicle (RV), camping trailer, or the like, in order to afford the best reception. One example of a roof-mounted off-air antenna for RVs is disclosed in U.S. Pat. No. 5,262,793.

Mounting an antenna outside of the vehicle lessens interference from electronics and a roof-mounted outdoor antenna is less likely to receive reflected ghost signals from the vehicle structure. In addition, mounting an antenna higher above the ground increases the amount of direct signal it can receive from a transmitter.

The antenna mounted on the roof is connected to one or more television appliances in the vehicle using, for example, coaxial cable lines and splitters routed throughout the vehicle structure. Reception can be improved for directional antennas by aiming (e.g. rotating) the antenna towards the source of the broadcast signal. The source direction can be different for different channels due to different locations of the respective broadcast towers for each channel.

Conventionally, the user is provided with an antenna adjustment mechanism inside of the vehicle cabin. The user typically scans for channels using the television appliance, and then rotates the roof-mounted antenna if the desired channel is not located. Following a rotation, the user performs another scan on the television to see if the desired channel is located. If not, a further rotation and scan is performed. This process is repeated until the desired channel is located or the user gives up trying to find the desired channel. If the channel is located, then the user can use a signal meter function built into the television appliance, if one exists, to tune or peak the signal strength by making adjustments to the antenna position while observing the television appliance. Some television appliances do not have a meter function. As can be appreciated from this description, the conventional method of locating television channels involves considerable guesswork. The user typically does not find the peak, or strongest direction, of the signal using the conventional method. Even if the television appliance decoder has the ability to display a signal meter on the television screen, the user may not be able to see it. Therefore, there is a need for an improved antenna system that allows a user to quickly and easily aim an off-air antenna.

SUMMARY

The present disclosure is directed to a rooftop-mounted off-air television antenna system, device and method, including an integral signal meter display. In one aspect of certain embodiments, the antenna portion of the device is mounted to the roof of a vehicle such as an RV. An antenna adjustment mechanism is located inside of the vehicle cabin in a place accessible to a user. The adjustment mechanism enables the user to adjust a position of the antenna on the roof, such as by rotating a dial that is mechanically linked to the antenna. Turning the dial correspondingly rotates the antenna. A signal meter is disposed in the adjustment mechanism and electrically connected to the antenna. A display of the signal meter readout is disposed in the adjustment mechanism in a location that can be easily viewed by a user during an aiming operation. The display allows the user first find the signal and then to determine when the antenna has been positioned in order to obtain the approximate maximum signal strength possible given the vehicle's current location.

In another aspect of certain embodiments, an off-air television antenna system comprises a base, a riser disposed on the base and an antenna disposed on the riser. The antenna is configured to receive television signals in the VHF and UHF frequency bands from terrestrial transmitters. An adjustment device is separated from the base, riser and antenna, and comprises an adjustment knob and a display. The display is located adjacent to the adjustment knob and configured to indicate the relative strength of the television signals received by the antenna. A shaft mechanically couples the adjustment device to the antenna such that rotation of the knob rotates the antenna.

In certain further aspects, the display comprises a plurality of individual lights in a row. An on/off switch and/or an attenuator can be provided to the adjustment device. A junction box can also be electrically connected to the antenna. A signal splitter can also be disposed in the base to direct the signal to the signal meter and to provide an output for the system. The riser and antenna can be secured together so that they rotate together as the knob is turned. Also, the shaft can comprise a first part configured to longitudinally slidably engage a second part, wherein the first and second parts are axially rotatable in unison.

In a further aspect of certain embodiments, an off-air television antenna connectable to a vehicle is disclosed. An antenna is disposed on the exterior surface of the roof of the vehicle and is configured to receive television signals in the VHF and UHF frequency bands from terrestrial transmitters. An adjustment mechanism assembly is disposed on the interior ceiling surface of the vehicle. The adjustment mechanism assembly includes a housing, an antenna azimuth adjustment knob provided to the housing, and a signal meter display provided to the housing.

In certain further aspects, an electric motor can be coupled to the antenna. A base and a riser can be disposed between the exterior surface of the roof of the vehicle and the antenna to fasten the antenna to the exterior surface of the roof. The base is securely fastened to the exterior surface, the riser is rotatably mounted on the base and the antenna is fastened to riser. A splitter can be disposed in the base and configured to direct signals received from the antenna to an output provided to the base and to a signal meter disposed in the adjustment mechanism assembly. The antenna can be mechanically coupled to the adjustment knob. A shaft can be secured to the adjustment knob and extend through the roof of the vehicle. The shaft can comprise a first part configured to longitudinally slidably engage a second part, with the first and second parts being axially rotatable in unison. The adjustment mechanism assembly can further include a signal attenuator.

In another aspect of the invention, a method of providing UHF and VHF television signals to a television appliance in a vehicle comprises disposing an antenna unit on an exterior surface of a roof of the vehicle. An adjustment mechanism assembly is disposed inside of the vehicle. The adjustment mechanism assembly includes a signal meter display and an antenna adjustment device. The signal meter display is viewed while rotating the antenna adjustment device through a full cycle of travel to determine a position of the antenna that corresponds to a maximum reading indicated on the signal meter display. The antenna is positioned to align with the position corresponding to the maximum reading.

In various further aspects, channels can be scanned with a television appliance. The signal can be attenuated with a signal attenuation device provided to the adjustment mechanism assembly. The antenna adjustment device can be mechanically linked to the antenna. Also, the riser can be used to securely locate the antenna above the exterior surface of the vehicle.

Additional aspects are explained in the detailed description. The above summary is not intended to limit the scope of the invention, or describe each embodiment, aspect, example, implementation, feature or advantage of the invention. The detailed technology and preferred embodiments for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

DETAILED DESCRIPTION

Figure 1:
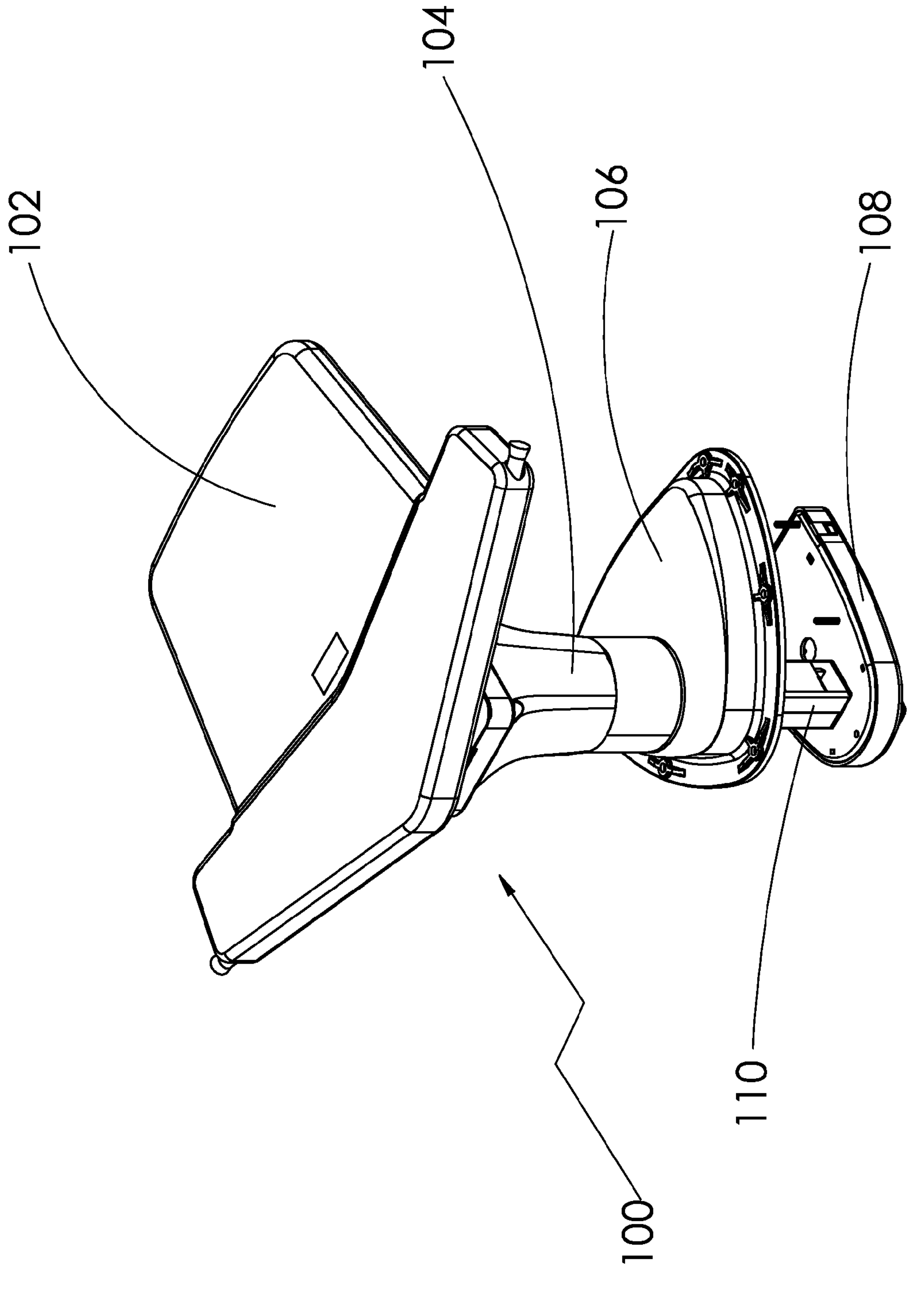
FIG. 1 is a perspective view of an off-air antenna system according to an example embodiment.

In the following descriptions, the present invention will be explained with reference to various example embodiments; nevertheless, these example embodiments are not intended to limit the present invention to any specific example, embodiment, environment, application, or particular implementation described herein. Therefore, descriptions of these example embodiments are only provided for purpose of illustration rather than to limit the present invention. The invention is to cover all modifications, equivalents, and alternatives falling within the scope of the invention as defined by the appended claims.

Referring to FIGS. 1-10, an off-air antenna system 100 is shown. The antenna system 100 comprises an antenna 102 disposed on a riser 104 above a base 106. An adjustment device or adjustment mechanism assembly 108 is operatively coupled to the antenna 102. The antenna 102 is located atop the riser or shroud 104, which is in turn atop the base 106.

The antenna 102, riser 104 and base 106 are configured to be fastened to the top of the exterior of a vehicle, such as an RV. The adjustment mechanism assembly 108 is located inside of the vehicle. In one embodiment, the adjustment mechanism assembly 108 is fastened to the ceiling inside of the vehicle. Alternatively, the antenna 102, riser 104 and base 106 can be mounted to a generally vertical surface, such as a side wall of a vehicle. In such alternative, the adjustment mechanism assembly 108 can also be located on the interior sidewall of the vehicle.

The adjustment assembly mechanism 108 in one embodiment is mechanically linked to the antenna 102 via a shaft 110. Thus an actuator 112, such as a knob, can be turned by an operator or user located inside of the vehicle to correspondingly rotate the azimuth direction of the antenna 102. The linkage can alternatively be electric. In such embodiment, the mechanical linkage is replaced with an electric motor 111 disposed in the base and/or riser to cause the antenna to rotate the antenna in response to an input, such as by an operator actuating a switch or other actuator on the adjustment assembly mechanism or by an electronic signal provided by a remote control or by a processor (for example, a signal decoder).

The antenna can be any type suited to receive VHF and/or UHF television signals, or any other desired type of signal. For example, such signals can include FM, WiFi, cellular data and WiMAX as well as other directional signals, or a combination thereof. The antenna can be a directional antenna where received signal is maximized when the antenna is pointed in the direction of the source.

The antenna components can be disposed inside of a housing. The housing can be formed of any suitable materials, such as plastics. The material selected for the housing surrounding the antenna elements is preferably electromagnetic wave permeable in order to minimize signal loss. Alternatively, the antenna components can be exposed (i.e. not in a housing or only partially housed) without departing from the scope of the invention. In a further alternative, the antenna elements can be affixed to or imprinted on a base or housing.

Figure 8:
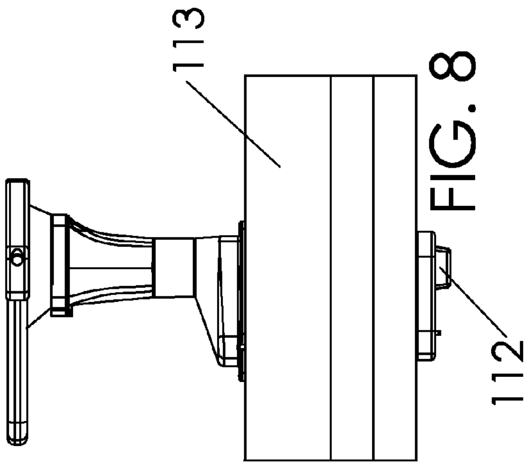
FIG. 8 is a side view of an off-air antenna system according to an example embodiment showing a cross-section of a vehicle roof.
Figure 4:
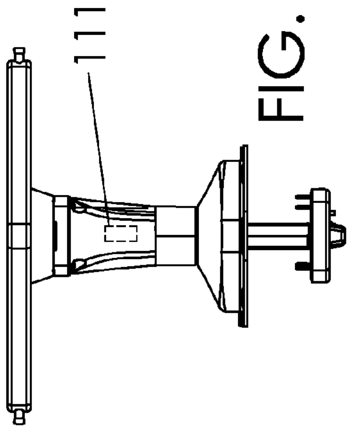
FIG. 4 is a front view of an off-air antenna system according to an example embodiment.
Figure 7:
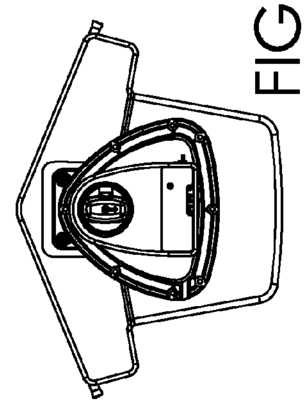
FIG. 7 is a bottom view of an off-air antenna system according to an example embodiment.
Figure 3:
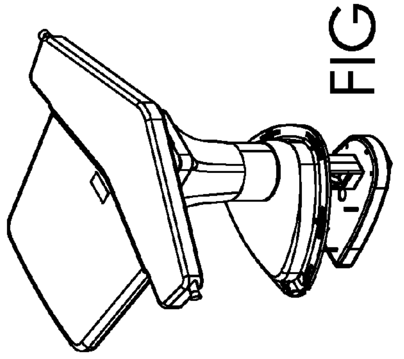
FIG. 3 is a perspective view of an off-air antenna system according to an example embodiment.
Figure 6:
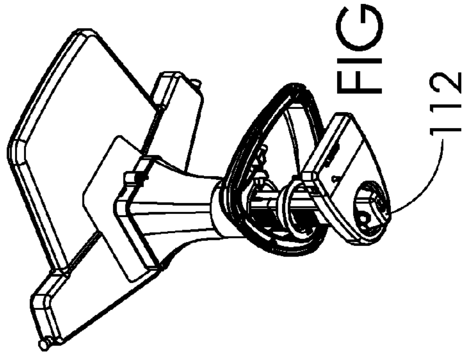
FIG. 6 is a perspective view of an off-air antenna system according to an example embodiment.
Figure 9:
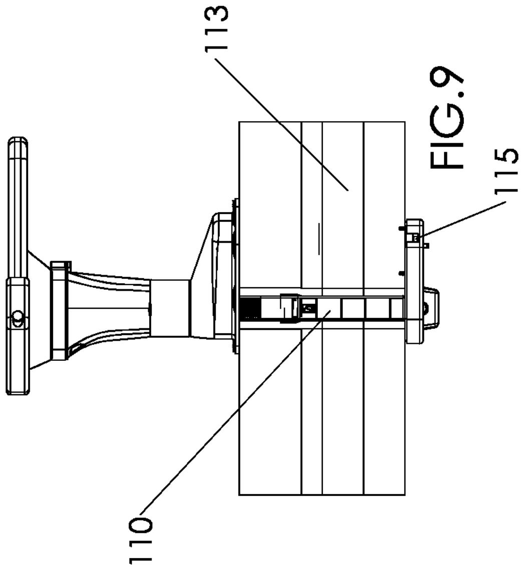
FIG. 9 is a side view of an off-air antenna system according to an example embodiment showing a cross-section of a vehicle roof.
Figure 10:
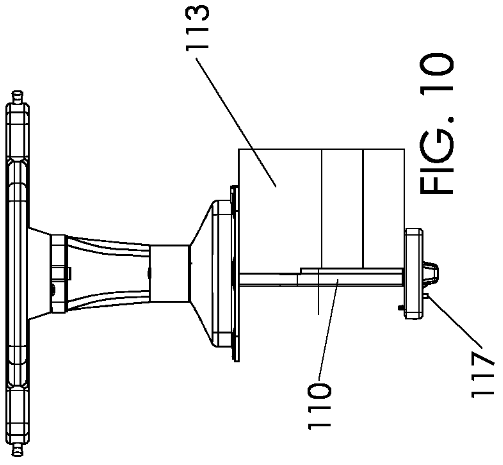
FIG. 10 is a rear view of an off-air antenna system according to an example embodiment showing a cross-section of a vehicle roof.

Referring to FIGS. 8-10, the antenna is shown fastened to a cross-section of a vehicle roof 113. The roof may comprise several layers as indicated in FIGS. 9-10 with the shaft 110 extending therethrough. Therefore, the distance between the base 106 and the adjustment mechanism assembly 108 can be varied or made adjustable to accommodate variable roof thicknesses. For example, compare the distance between these components in FIG. 5 with FIG. 9. Adjustability in a mechanical arrangement can be accomplished by having a shaft slidably insertable into a hollow bore or aperture of a connector member.

Figure 2:
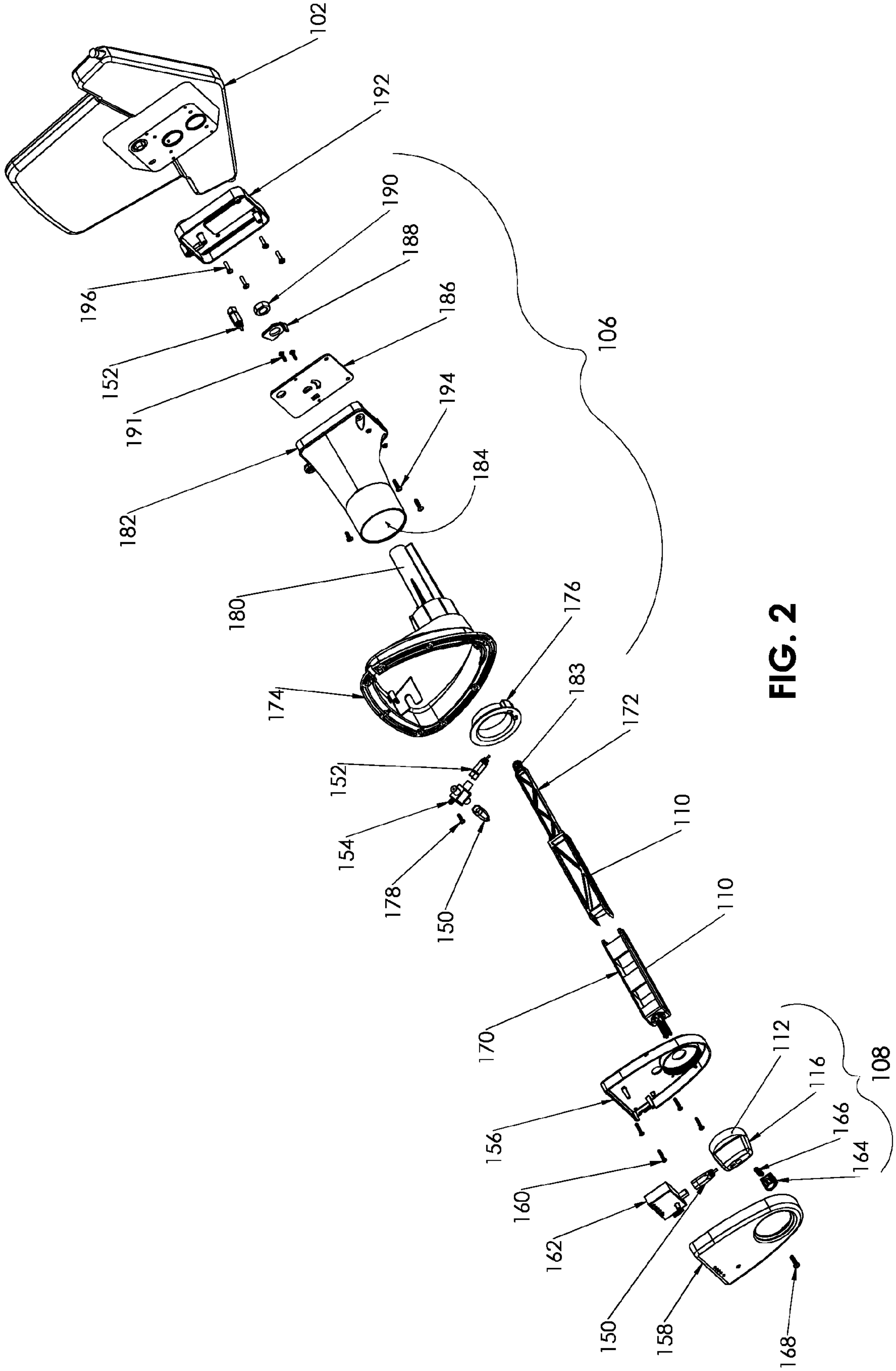
FIG. 2 is an assembly view of an off-air antenna system according to an example embodiment.
Figure 5:
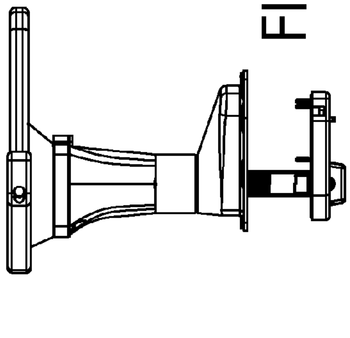
FIG. 5 is a side view of an off-air antenna system according to an example embodiment.

Various components of one embodiment are depicted in FIG. 2. A coaxial cable 150 spans from the internal adjustment mechanism assembly 108 to the external base 106. Another cable 152 spans from the external base 106, though the riser 104 and connects with the electronics in the antenna unit 102. A 2-Way splitter (5-900 MHz, 0.8"×0.8") 154 connects the cables 150 and 152 together inside of the exterior base 106 so that the output from the antenna system 100 is through the base above the roof of the vehicle and so that the signal meter can also receive the signal from the antenna unit for evaluation.

The interior adjustment mechanism assembly 108 comprises an assembly as can be seen in the figure. The assembly 108 comprises an enclosure base 156 and cover 158. The base 156 and cover 158 are fastened together by a plurality of screws 160 and form an enclosed area. The signal meter component 162 is disposed inside of the enclosed area. The signal meter component includes the display, which is made visible through the cover 158 by respective openings or via a window. The adjustment knob 112 protrudes outwardly from the cover 158 towards the interior of the vehicle in which it is mounted. A release lever 164 can be provided to prevent the knob 112 from being accidentally turned. The knob release lever 164 is biased outwardly with a spring 166. The user thus presses the lever 164 inwards to make rotation of the knob 112 possible. A screw 168 fastens the knob 112 to the shaft 110.

The shaft 110 physically connects the knob 112 to the antenna unit 102. Shaft 110 comprises a first portion 170 and second portion 172. The first portion 170 is secured to the knob 112 and has an aperture defined therein for receiving at least a part of the second portion 172 therein. The second portion is coupled to the antenna unit 102. It is understood however, that the male/female portions of the respective first 170 and second 172 portions of the shaft 110 could be reversed without departing from the scope of the invention. The shaft 110 can also be a one-piece shaft. However the two-piece configuration allows for easier assembly/disassembly and for height adjustability.

The exterior base portion 106 receives the junction of the coaxial cables and the splitter 154 discussed above. The splitter 154 is retained in place with a screw 178. The exterior base portion includes a base mount 174 into which a ring seal 176 is disposed. The ring seal 176 reduces the likelihood of moisture entering the cabin of the vehicle via the juncture of the riser 104 with the base 106. The base mount 174 includes an upwardly protruding portion 180 that extends at least partially into the shroud 182 of the riser 104. The upwardly protruding portion 180 includes a hollow central passage to permit passage of the shaft 110.

The riser 104 comprises a shroud 182 having a hollow central passage 184 to receive the upwardly protruding portion 180 and shaft 110. A mounting plate 186 is disposed in an upper portion of the shroud 182. A threaded end 183 of the shaft 110 protrudes past the mounting plate 186 and is secured thereto by a stop or washer 188, nut 190 and screws 191. A shroud cap 192 is secured to the top of the shroud 182 with a plurality of screws 194 to enclose the components inside of the shroud. It should be understood that in this configuration, the riser rotates as the knob 112 is turned.

The antenna unit 102 is fastened to the top surface of the shroud cap 192 with a plurality of screws 196. Thus, the antenna unit 102 rotates as the knob 112 is turned by a user.

It should be understood, however, that the above-noted parts and structure can be altered without deviating from the scope of the invention unless specifically limited in the appended claims.

Figure 11:
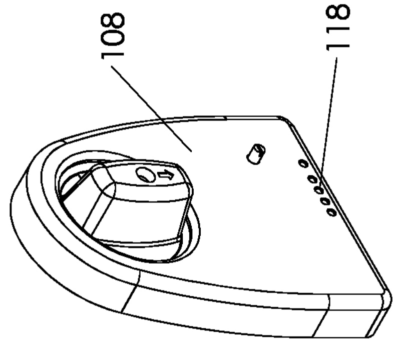
FIG. 11 is a perspective view of an adjustment mechanism for an off-air antenna system according to an example embodiment.
Figure 12:
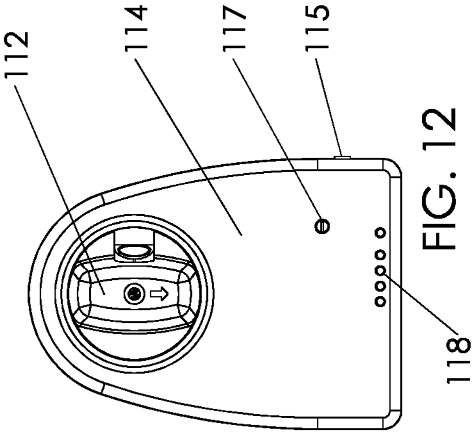
FIG. 12 is a front view of an adjustment mechanism for an off-air antenna system according to an example embodiment.
Figure 13:
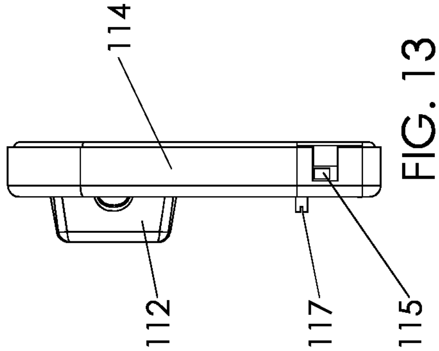
FIG. 13 is a side view of an adjustment mechanism for an off-air antenna system according to an example embodiment.

Referring now specifically to FIGS. 11-13, the adjustment mechanism assembly 108 is shown. The assembly includes a housing 114 and an adjustment device 112, such as a knob. The knob 112 is configured to be rotatable by a user in order to adjust the position or orientation of the antenna outside of the vehicle. In particular, the azimuth of the antenna 102 can be adjusted by rotating knob 112. Other types of mechanisms 112 can be used, such as a switch, crank or lever, without departing from the scope of the invention.

The housing 114 includes a signal meter electrically connected to the antenna components. A visual indicator or display 118 of the signal strength further is provided to the housing. The display 118 is configured to provide a visual indication of the strength of the signal being received by the antenna 102. The display can be a series of lights, as shown, that illuminate to show increasing strength. For example, no lights means no signal; one light is a weak signal and progressively more lights are lit as the signal increases up to the point that all lights are lit. The lights can be lit in equal proportions relative to the signal strength, or they can be disproportionate. Any number of lights may be used. Alternative display arrangements are also within the scope of the invention. For example, a digital readout or a gauge may be used. The lights may be LEDs or other suitable illumination source. The lights may also be the same color or different colors to indicate increasing or decreasing strength. In a further alternative, a single light may be provided that shifts color or intensity to indicate relative signal strength. A combination of the above and multiple display types can also be provided.

An attenuator can also be included in the signal meter system. The attenuator allows the indicated signal strength to be scaled so that visual distinctions on the meter can be more easily made between multiple similarly-strong appearing signals. Attenuation can be implemented in an automatic manner where the electronics adjust scaling or resolution based upon a measured signal reading. Attenuation can also be implemented by providing an attenuation dial or knob 117 that the user can manually adjust.

Additional status lights may also be provided to the housing. For example, a lock status light and a power status light can be provided to the housing 114. That housing can further include an on/off switch 115.

Figure 14:
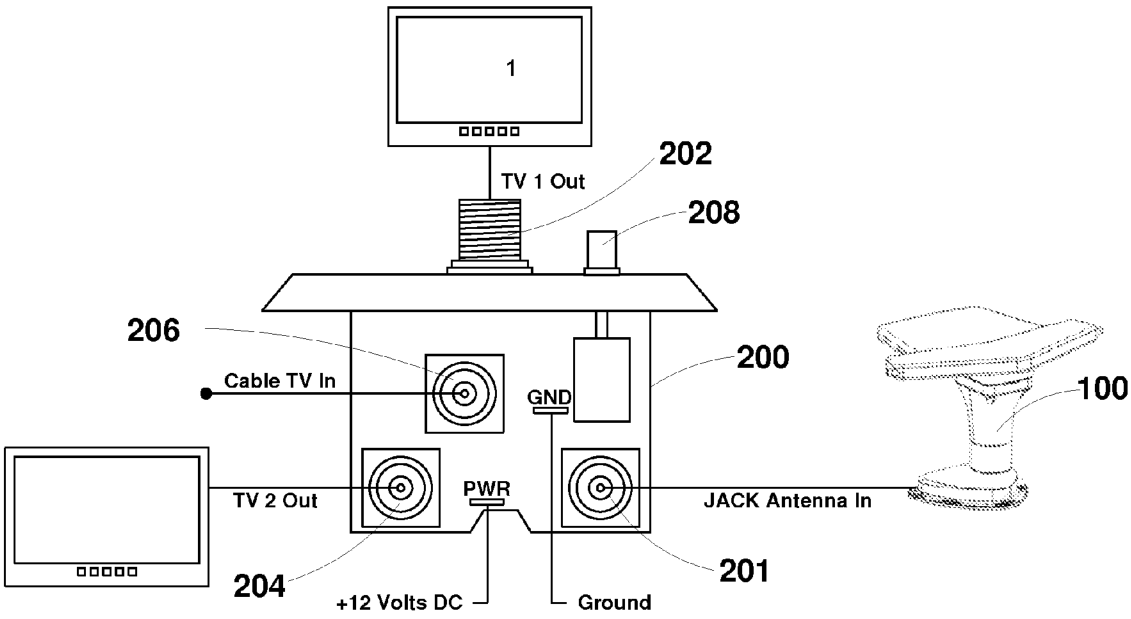
FIG. 14 is an electrical connection diagram for an off-air antenna system according to an example embodiment.

Referring to FIG. 14, an example of connecting the antenna system 100 to television appliances is shown. The antenna 100 is connected to a junction box 200. The box 200 is both grounded and connected to a 12 volt power source. The junction box 200 splits the antenna output (inputted to box 200 at connector 201) into one or more outputs, such as at first 202 and second 204 output connectors. The first output 202 being associated with a first television appliance TV1 and the second output 204 being associated with a second television appliance TV2. It is understood that the television appliances can be either a television or a converter box that is subsequently connected to a television. The junction box 200 also can include a cable or satellite television signal input connector 206 to receive and combine with the output of the antenna 100 before output to the televisions. The junction box 200 can also include an amplifier and an on/off switch 208. The junction box can be mounted to a wall panel in the vehicle or other suitable location. The junction box in other configurations can also have a single television output or more than two such outputs.

Figure 15:
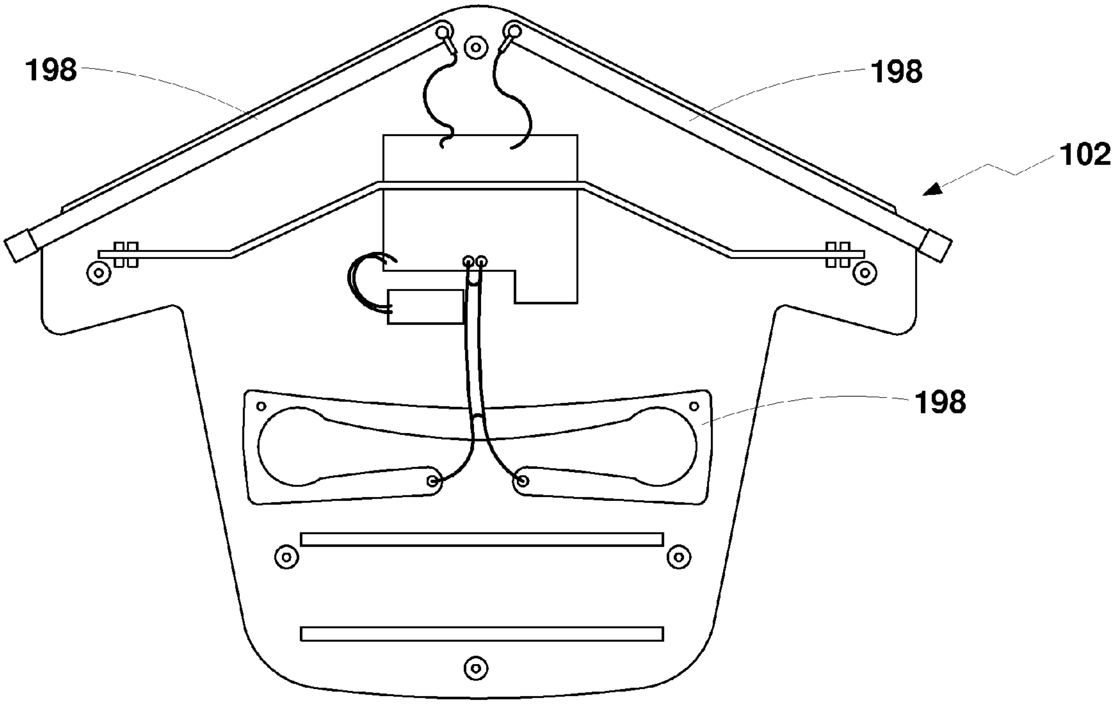
FIG. 15 is a top view showing various antenna components disposed in an antenna housing according to an example embodiment.

Referring to FIG. 15, the antenna unit 102 includes the antenna elements 198 configured to receive the desired television signals, for example UHF and VHF signals. However the invention is not limited to the antenna components and configuration shown in FIG. 15. Other suitable antenna types, configurations components can be used without departing from the scope of the invention.

The antenna system 100 also can include an amplifier to amplify the signal being received by the antenna. An amplifier adjustment device can further be provided to the housing 114.

The antenna system 100 can further be used in conjunction with a power injector to supply both power and signal to the antenna system. Further detail regarding the power injector is described in the appendix to the incorporated U.S. Provisional Application 61/433,175.

In use, the user turns the system 100 on (if not already on), rotates the antenna using the adjustment knob 112 while watching the display 118, stopping at the point which provides the strongest signal strength as indicated by the signal meter display 118. Then the instructions for the television appliance or converter are followed to scan in the available channels.

In a further aspect, the antenna system 100 is configured to remain in a deployed condition at all times. Thus, it is not necessary to collapse the antenna portion on the roof prior to transit or deploy the antenna portion on the roof when viewing is desired. Plus, the low profile and aerodynamic shape of the antenna 102 may permit viewing of television, or other types of signals, while the vehicle is in motion because the antenna can remain deployed while in motion.

In a further aspect, the antenna system can be configured so that the height of the antenna component above the roof of the vehicle is adjustable. This can be provided by either mechanical or motorized configurations. A height adjustment knob or switch can be incorporated into the interior housing 114. Alternatively, azimuth or rotation adjustment knob 112 can be configured for multiple operations, such as push-pull plus rotational movement.

In another aspect, the antenna assembly 102 on the roof of the vehicle can be motorized. An electric motor can be disposed in the antenna 102, riser 104 and/or base 106 and operatively coupled to the antenna to selectively adjust the antenna rotation and/or height. Thus, for example, the rotation can be automated by the motor in response to manual or automatic input. Adjustable height can also be automated in a similar manner.

Additionally, a micro-controller can be incorporated into the system and configured to automatically find and lock onto the direction of the strongest signal or another target location as desired or determined. In such arrangement, the user can push a “find” button or switch and the antenna system will automatically find the strongest signal or aim in a direction as determined by the control logic. In-motion tracking can also be provided by this configuration. In motion, the motors continually adjust the aim of the antenna to stay locked on to the target energy source.

In yet another aspect, the antenna system can be configured without a signal meter.

In a further aspect, the antenna orientation or position corresponding to a locked or acquired signal can be stored in memory provided to the antenna. Thus, the antenna can search for additional channels, which may require adjusting the orientation of the antenna, without re-locking on the one or more valid locations already located. Multiple antenna orientations can be stored in this manner so that the user is provided with the ability to more quickly switch or jump between channels that have already been located and stored in memory. Such jumping is faster than searching each time a new channel is selected. The input to the antenna system requesting a jump or switch can be provided by input by the user, such as pressing a button, or automatically by another means, such as a remote control or a control box or the television appliance providing a signal requesting a switch. The command to store a location can be provided automatically as well, including the system storing a position without external request, or manually. The user can also designate an invalid position that will be skipped in a subsequent search so that the invalid position does not get re-locked in a subsequent search. The system can also perform a general scan upon startup, or by a command of the user, and lock in a predetermined number (e.g. 2, 3, 4, 5, etc.) of signal source candidate orientations. Then the user can jump between these candidates rather than searching and locking orientations in a serial manner. Subsequent scans can be performed to repopulate the set of candidate orientations after one or more candidate orientations has been marked as invalid.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products. Moreover, features or aspects of various example embodiments may be mixed and matched (even if such combination is not explicitly described herein) without departing from the scope of the invention.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An off-air television antenna system, comprising:

a base;

a riser disposed on the base;

an antenna disposed on the riser, the antenna configured to receive television signals in the VHF and UHF frequency bands from terrestrial transmitters;

an adjustment device separated from the base, riser and antenna, the adjustment device comprising an adjustment knob and a display, the display located adjacent to an adjustment knob and comprising a plurality of individual lights in a row to indicate the relative strength of the television signals received by the antenna;

a shaft mechanically coupling the adjustment device to the antenna such that rotation of the knob rotates the antenna, wherein the shaft comprises a first part configured to longitudinally slidably engage a second part to accommodate a range of antenna heights, the first and second parts being axially rotatable in unison.

2. The system of claim 1, wherein the adjustment device further comprises an attenuator provided thereto.

3. The system of claim 1, further comprising a signal splitter disposed in the base to direct a television signal to the signal meter and to provide an output for the system.

4. The system of claim 1, wherein the riser and antenna are secured together so that they rotate together as the knob is turned.

5. The system of claim 1, wherein the adjustment device further comprises an adjustment knob release lever coupled to the adjustment knob to prevent the knob from being accidentally turned.

6. An off-air television antenna connectable to a vehicle, the vehicle having a roof with an exterior surface and an interior ceiling surface, comprising:

an antenna disposed on the exterior surface of the roof of the vehicle and configured to receive television signals in the VHF and UHF frequency bands from terrestrial transmitters; and an adjustment mechanism assembly disposed on the interior ceiling surface of the vehicle, the adjustment mechanism assembly comprising:

a housing;

an antenna azimuth adjustment knob provided to the housing;

a signal meter display provided to the housing, the signal meter display comprising a plurality of individual lights in a row; and a shaft mechanically coupling the adjustment knob to the antenna such that rotation of the knob rotates the antenna, wherein the shaft comprises a first part configured to longitudinally slidably engage a second part to accommodate a range of antenna heights, the first and second parts being axially rotatable in unison.

7. The antenna of claim 6, further comprising a base and a riser disposed between the exterior surface of the roof of the vehicle and the antenna to fasten the antenna to the exterior surface of the roof, the base being securely fastened to the exterior surface, the riser rotatably mounted on the base and the antenna fastened to riser.

8. The antenna of claim 7, further comprising a splitter disposed in the base and configured to direct signals received from the antenna to an output provided to the base and to a signal meter disposed in the adjustment mechanism assembly.

9. The antenna system of claim 6, wherein the adjustment mechanism assembly further comprises a signal attenuator provided thereto.

10. The antenna of claim 6, wherein the adjustment mechanism assembly further comprises an adjustment knob release lever coupled to the adjustment knob to prevent the knob from being accidentally turned.

11. A method of providing UHF and VHF television signals to a television appliance in a vehicle, comprising:

disposing an antenna unit on an exterior surface of a roof of the vehicle;

disposing an adjustment mechanism assembly inside of the vehicle, the adjustment mechanism assembly including a signal meter display, an antenna adjustment device, and a shaft disposed between the antenna adjustment device and the antenna unit such that rotation of the adjustment mechanism rotates the antenna unit, wherein the shaft comprises a first part configured to longitudinally slidably engage a second part to accommodate a range of antenna heights, the first and second parts being axially rotatable in unison;

viewing the signal meter display disposed in the adjustment mechanism assembly while rotating the antenna adjustment device through a full cycle of travel to determine a position of the antenna that corresponds to a maximum reading indicated on the signal meter display;

rotating the antenna via the antenna adjustment device to align the antenna with the position corresponding to the maximum reading.

12. The method of claim 11, further comprising scanning for channels with a television appliance.

13. The method of claim 11, further comprising adjusting a signal attenuation device provided to the adjustment mechanism assembly.

14. The method of claim 11, wherein the step of disposing an antenna unit on an exterior surface of a roof of the vehicle includes fastening the antenna to a riser to securely locate the antenna above the exterior surface.

15. The method of claim 11, further comprising preventing the adjustment device from accidentally turning the antenna unit by engaging an adjustment device release lever with the adjustment device.

* * * * *